United States Patent [19]

Ohba

[11] Patent Number: 4,902,645
[45] Date of Patent: Feb. 20, 1990

[54] METHOD OF SELECTIVELY FORMING A SILICON-CONTAINING METAL LAYER

[75] Inventor: Takayuki Ohba, Yokohama, Japan

[73] Assignee: Fujitsu Limited, Kawasaki, Japan

[21] Appl. No.: 235,403

[22] Filed: Aug. 23, 1988

[30] Foreign Application Priority Data

Aug. 24, 1987 [JP] Japan .................................. 62-209534
Mar. 11, 1988 [JP] Japan .................................. 63-058821

[51] Int. Cl.$^4$ ...................... H01L 21/00; H01L 21/02; B05D 3/06; B05D 5/12
[52] U.S. Cl. ...................................... 437/200; 437/187; 437/189; 437/192; 437/195; 148/DIG. 19; 148/DIG. 147
[58] Field of Search .............. 437/200; 148/DIG. 147

[56] References Cited

U.S. PATENT DOCUMENTS

| 4,218,291 | 8/1980 | Fukuyama et al. | 204/192.25 |
| 4,582,563 | 4/1986 | Hazuki et al. | 156/644 |
| 4,684,542 | 8/1987 | Jasinski et al. | |
| 4,766,006 | 8/1988 | Gaczi | 437/39 |

FOREIGN PATENT DOCUMENTS 59-72132  4/1984  Japan .
62-267472 11/1987  Japan .

OTHER PUBLICATIONS

Moriya, T., A Planar Metallization Process—Its Application to Tri-Level Aluminum Interconnection, pp. 550–553, IEDM 83.
Ghate, B., Metallization for Very-Large Scale Integrated Circuits, Thin Solid Films, vol. 93, 1982, pp. 359–381.
Ghandhi, S., VLSI Fabrication Principles, Chap. 11, pp. 585–587, Wiley & Sons, 1983.

Primary Examiner—Brian E. Hearn
Assistant Examiner—B. Everhart
Attorney, Agent, or Firm—Armstrong, Nikaido, Marmelstein, Kubovcik & Murray

[57] ABSTRACT

A method of selectively forming (growing or depositing) a silicon-containing metal layer on an exposed surface of a semiconductor substrate or a conductor by using a metal halide gas and a silicon hydride gas at a ratio of a flow rate of the latter gas to that of the former gas (e.g., $Si_nH_{2n+2}/WF_6$) of 2 or less, and setting a growth temperature at 200° C. or less. When a $Si_3H_8$ gas and a $WF_6$ gas, in particular, are used at a ratio of the flow rates ($Si_3H_8/WF_6$) of 1.0 or less, and the deposition temperature is set at 100° C. to room temperature, a silicon-containing tungsten layer is selectively deposited (formed).

21 Claims, 10 Drawing Sheets

METHOD OF SELECTIVELY FORMING A SILICON-CONTAINING METAL LAYER

BACKGROUND OF THE INVENTION

1. Field of the Invention

The present invention relates to a method of forming a conductor layer through a vapor growth (deposition) process, and more particularly to a method of selectively forming a silicon-containing metal layer to fill a contact hole for a silicon substrate or a conductor layer of, for example, aluminum of a semiconductor device, or to cover a conductor layer in a semiconductor device.

2. Description of Related Art

Recently, the number of components for a semiconductor device such as an LSI has increased and the dimensions of the device have been reduced. The filling of contact holes, reliability of conductor layers (interconnections), low resistance contact to a silicon substrate, barrier metal formation, etc., all require improvement: For example, the miniaturization of a conductor (interconnection) pattern is accompanied by a decrease in contact hole dimensions, and when a conductor layer is formed to come into contact with a silicon substrate through such a small contact hole, step coverage of the conductor layer becomes poor. To solve these step coverage problems, the contact hole is filled with a refractory metal such as tungsten (W), which is selectively deposited therein by vapor phase deposition (growth), and the conductor layer is formed over the filler (i.e., refractory metal layer) to electrically connect with the silicon substrate through the filler. The selective deposition of W is carried out by using a reaction gas mixture of a $WF_6$ gas and a $H_2$ gas at a temperature of 400° C. or more to obtain a practical deposition rate. A proposal was made in which tungsten silicide is selectively deposited by using a silane ($SiH_4$) gas instead of the $H_2$ gas (Japanese Unexamined Patent Publication (Kokai) No. 59-72132, published on Apr. 24, 1984). In an example of Japanese Publication No. 59-72132, a contact hole is filled with a tungsten layer in a low pressure CVD (chemical vapor deposition) reactor under the conditions of flow rates of a $WF_6$ gas, a $SiH_4$ gas and an argon (Ar) gas of 1 cc/min, 3 cc/min and 1000 cc/min, respectively, an inside pressure of the reactor of 0.2 Torr, and a substrate temperature of 450° C.

A method of depositing metal silicide such as molybdenum silicide and tungsten silicide ($MSi_x$: M indicates metal, $1.7 \leq x \leq 2.3$) by low-pressure vapor phase deposition is disclosed in Japanese Unexamined Patent Publication (Kokai) No. 62-267472 (published on Nov. 20, 1987, later than the first priority date of the present application, and corresponding to U.S. Ser. No. 863,622). In this case, in Example 1 for example, a flow rate of a $SiH_4$ gas is 5-27 times as large as that of a $MoF_6$ gas and a blanket deposition instead of a selective deposition occurs. U.S. Pat. No. 4,684,542 discloses that tungsten silicide ($WSi_x$: $2.2 \leq x \leq 3.4$, FIG. 5) is vapor phase deposited on a substrate by using a $WF_6$ gas and a higher order silane gas ($Si_nH_{2n+2}$, $n=2, 3, \ldots$). In this case, a flow rate of the high order silane gas is larger than that of the $WF_6$ gas, and a blanket deposition instead of the selective deposition occurs.

In the selective deposition of tungsten using the $WF_6$ gas and the $H_2$ gas, an encroachment or a worm hole in a silicon substrate occurs and increases the junction leakage in a semiconductor device.

When the selective deposition is made using a $SiH_4$ gas instead of an $H_2$ gas, the deposition temperature is still relatively high, and a method of selective deposition at a lower temperature is required.

The miniaturization and a greater integration of a semiconductor device are accompanied by a decrease in the width and thickness of a conductor layer of aluminum (Al) or aluminum alloy (Al alloy). Consequently, the generation of metal voids or hillocks, and the generation of stress migration due to thermal stress and interlaminar stress and/or the generation of electromigration due to an increase of the current density, increase open circuit failures of the conductor layers. To decrease the open circuit failures, attempts have been made in which copper (Cu) and/or titanium (Ti) are added into Al (or Al alloy) of the conductor layer, the stress of a laminated layer is decreased, and a tungsten layer is selectively formed on a surface of the conductor layer only. Such a selective formation of tungsten is carried out by a vapor phase deposition due to a chemical reaction of a $WF_6$ gas and a $SiH_4$ gas. In general a selective or blanket deposition (growth) of tungsten or tungsten silicide is carried out at a relatively high temperature of 300° C. or more, but as miniaturization is increased, the influence of thermal stress due to a formation process (e.g., increase of stressmigration) can not be ignored, and as a result, a lower temperature process (if possible, a formation process at room temperature) is required.

SUMMARY OF THE INVENTION

An object of the present invention is to provide a method of selectively forming a conductor layer including a main component of refractory metal (e.g., W or Mo) on an exposed surface of a silicon substrate in a contact hole or on a conductor layer of Al, etc., to increase the reliability of conductor layers, at a lower deposition temperature.

Another object of the present invention is to provide a method of increasing the adhesion strength of the conductor line selectively formed at a lower deposition (growth) temperature to the silicon substrate or conductor layer.

The above-mentioned and other objects of the present invention are attained by providing a method of forming a silicon-containing metal layer on an substrate with a surface of a conductor or semiconductor and a surface of insulator with a low pressure chemical vapor deposition by using a metal halide gas and a silicon hydride gas as reaction gases. According to the present invention, a ratio of a flow rate of the silicon hydride gas to that of the metal halide gas is set at 2 or less and a deposition temperature of the film is set at 200° C. or less, so as to selectively form the silicon-containing metal layer on the surface of the conductor or semiconductor of the substrate.

The metal of the silicon-containing metal layer is one of W, Mo, Ti, Ta, Pt or Pd. The silicon-containing metal formed in accordance with the method of the present invention is shown by the chemical formula $MSi_x$ (M indicates metal, the proportion (molar ratio) "x" of Si to M is 0.6 or less, preferably $0.01 \leq x \leq 0.1$); namely, a smaller amount of silicon than a silicon content of a metal silicide $MSi_2$ is contained. This metal may contain a silicon impurity.

The metal halide gas is a conventionally used fluoride gas or chloride gas, such as $WF_6$, $MoF_6$, $TaF_5$, $TiF_4$, $WCl_6$, $MoCl_6$, $TaCl_5$ and $TiCl_4$.

Preferably, the silicon hydride gas is a gas indicated with a chemical formula $Si_nH_{2n+2}$ (n=1, 2, 3, ...). Since a higher order silane gas is adopted to lower the selective deposition temperature, as explained hereinafter, preferably disilane ($Si_2H_6$), and in particular, trisilane ($Si_3H_8$), are used.

The preferable conditions for the selective formation of the silicon-containing tungsten film are as follows:

when using a $SiH_4$ gas, the ratio of the flow rates ($SiH_4/WF_6$) is set to 2 or less and the deposition temperature is set to 200° to 180° C.;

when using a $Si_2H_6$ gas, the ratio of the flow rates ($Si_2H_6/WF_6$) is set to 1 or less and the deposition temperature is set to 200° to 80° C.; and when using a $Si_3H_8$ gas, the ratio of the flow rates ($Si_3H_8/WF_6$) is set to 0.7 or less and the deposition temperature is set to 100° to room temperature.

Preferably, an exposed surface of the silicon substrate and/or conductor layer is cleaned by an etching treatment immediately before the selective formation of the silicon-containing tungsten layer. An $SiO_2$ thin layer is easily formed on the silicon substrate surface, and an $Al_2O_3$ thin layer is easily formed on the Al (or Al alloy) conductor layer surface (namely, native oxide films are easily formed). If the oxide thin layers remain on the surfaces, these layers prevent the deposition growth of the silicon-containing metal layer, decrease the adhesion strength of the layer to the surfaces, and increase the contact resistance. The native oxide thin layers are then removed, and a good silicon-containing metal layer can be then selectively grown.

In general, as the deposition temperature is lowered, the adhesion strength of the selectively formed film is decreased. Although the low temperature deposition (growth) reduces the thermal stress, the lowering of the adhesion strength may lower the reliability of a semiconductor device. To realize an increase of the adhesion strength and a low temperature process (growth), it is preferable that a buffer layer of refractory metal or silicon-containing metal is selectively formed to cover the exposed surfaces, by heating the silicon substrate or conductor line at a high temperature of 400° to 500° C. for 10 to 30 seconds in a gas mixture containing a metal halide gas such as $WF_6$ and a reducing gas such as $H_2$ and $SiH_4$, before the above-mentioned selective formation of the silicon-containing metal layer. This buffer layer increases the adhesion strength and acts as the growth nuclei for a following deposition of a silicon-containing metal layer, to thus contribute to a uniform formation of the following layer in the semiconductor wafer.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Referring to FIGS. 1A to 1D, a contact hole opened in an insulator layer for connecting a conductor layer with a silicon substrate is filled with a silicon-containing metal layer selectively deposited (grown) in accordance with a formation method of the present invention.

Figure 1A:
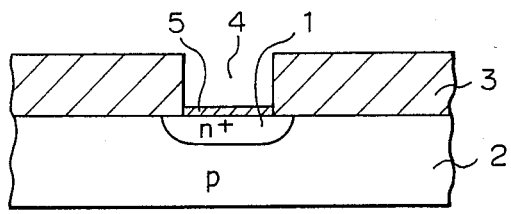
FIGS. 1A to 1D are schematic sectional views of a silicon substrate for illustrating a method of forming a silicon-containing metal layer according to the present invention.

As shown in FIG. 1A, an insulator layer ($SiO_2$ layer) 3 is formed on a p-type silicon (Si) substrate 2 having an n-type impurity doped region 1, by a conventional process, e.g., a thermal oxidation process or a CVD process. In addition to $SiO_2$, other materials such as PSG, BSG, BPSG, $Si_3N_4$, and polyimide can be used for the insulator layer 3. The $SiO_2$ layer 3 is selectively etched to form a contact hole 4 in which the impurity doped region 1 is exposed, and while the substrate 2 is being transferred to a next process station, the exposed silicon is oxidized by oxygen in the air to form an $SiO_2$ native oxide thin layer 5 on the exposed surface of the impurity doped region 1.

Figure 1B:
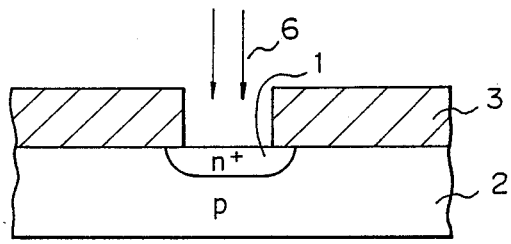

As shown in FIG. 1B, the $SiO_2$ thin layer 5 is removed by using an etching gas 6. This dry etching treatment is carried out by applying a high frequency power (13.56 MHz, 100 W) to an $H_2$ gas or an inert gas such as Ar, He, and $N_2$ under a low pressure condition to excite the gas into a plasma state and remove $SiO_2$ with a sputtering effect. $SiO_2$ can be removed by an etching using an activated halide gas such as $NF_3$, $CCl_4$, $SF_6$, and $BCl_3$, with an energy source such as microwaves, high frequency waves, and ultraviolet light. In the etching process, not only the $SiO_2$ thin layer 5 but also the insulator layer ($SiO_2$ layer) 3 are simultaneously etched, but since the insulator layer 3 is much thicker than the $SiO_2$ thin layer 5, the insulator layer 5 remains almost unchanged.

Figure 1C:
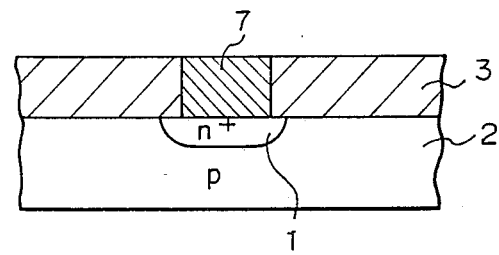

To prevent the formation of a new native oxide film on the exposed surface of the silicon substrate 2, i.e., to stop oxidation of the exposed surface in air, as shown in FIG. 1C, in accordance with the method of the present invention, a silicon-containing tungsten layer 7 is selectively formed on the exposed silicon surface of the impurity doped region 1, using a $WF_6$ gas and a silicone hydride gas, to fill the contact hole up to the level of the surface of the insulator layer ($SiO_2$ layer) 3.

Figure 1D:
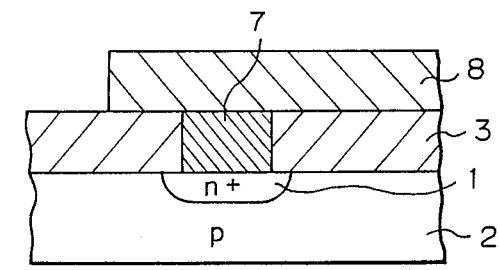

Next, as shown in FIG. 1D, a conductor layer of Al, Al alloy or the like is formed over the whole surface by a sputtering process or an evaporation process, and is selectively etched to form a conductor layer 8 having a desired pattern, and thus the conductor layer 8 is in effective contact with filled silicon-containing tungsten layer 7.

The above-mentioned formation of the silicon-containing tungsten layer is now explained with reference to FIGS. 2 to 5, showing the results obtained from experiments made by the present inventor.

For the growth, a cold-wall, parallel-plate and load-lock type reaction apparatus (reactor) was used, and reaction gases ($WF_6$, and $SiH_4$, $Si_2H_6$, $Si_3H_8$ (4% /Ar) and $H_2$ (comparative example) serving as a reducing gas to $WF_6$) and a carrier gas (He or Ar) were used. The flow rates of the reaction gases were set at 1 to 20 SCCM, the flow rates of the $H_2$ and carrier gas were set at 0.5 to 2 SLM, the deposition temperature (substrate heating temperature) was set at room temperature to 460° C., and the deposition pressure (inside pressure of reactor) was set at 0.2 to 0.3 Torr. Furthermore, the ratios of the flow rates of reaction gases were set as follows:

$SiH_4/WF_6 = 1.0$
$Si_2H_6/WF_6 = 0.5$
$Si_3H_8/WF_6 = 0.3$

Figure 2:
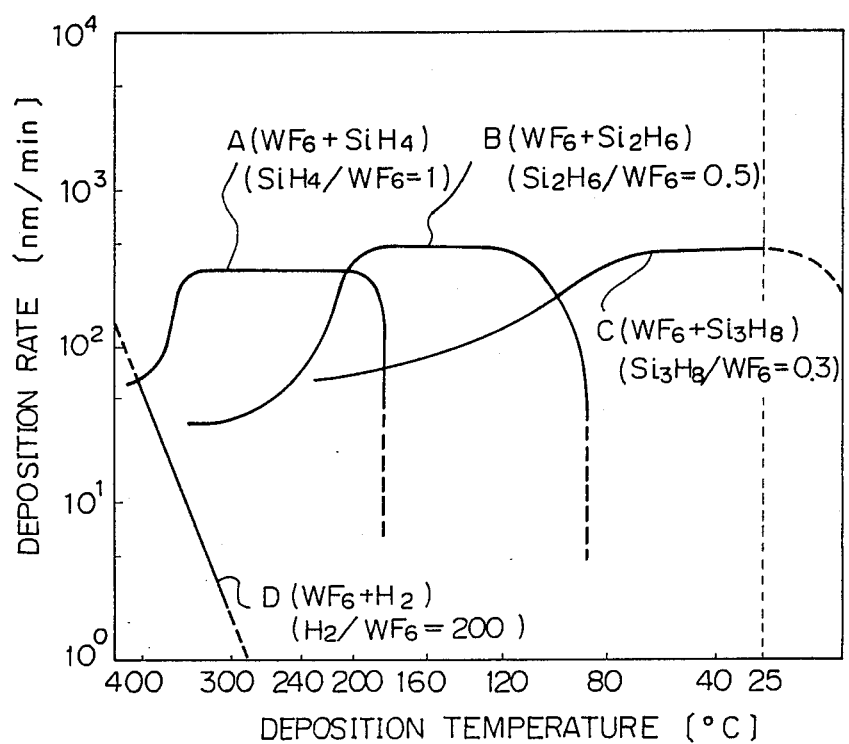
FIG. 2 is a graph showing a relationship between deposition rates and deposition temperatures of tungsten layers when using silicone hydride gases and $H_2$ gas.

The deposition (growth) rates of the silicon-containing tungsten layers A, B and C and the tungsten layer D were the measured. The relationships of the deposition rates of the layers A to D to the deposition temperature are shown in FIG. 2. As seen from FIG. 2, the reduction reaction in the tungsten deposition (D) using $WF_6$ and $H_2$ is a rate-limited reaction, and the reduction reaction in the silicon-containing tungsten depositions (A, B and C) using $WF_6$ and $Si_nH_{2n+2}$ ($n=1, 2, 3$) according to the present invention is a mass-transport limited reaction. In the case of $Si_nH_{2n+n}$, the larger the order "n", the lower the deposition temperature.

$Si_3H_8$ causes a deposition at room temperature (25° C.). This deposition rate is a deposition thickness per unit time on the exposed surface of a silicon substrate.

If the deposition temperature in the silicon-containing tungsten deposition (A, B and C) rises, the deposition rates are decreased and within a range of suitable temperatures, a selective deposition (growth) due to an exposed surface reaction and a following surface reaction of the deposited silicon-containing tungsten predominates. When the temperature is high, a deposition due to a vapor phase reaction occurs, and silicon-containing tungsten is deposited not only in the contact hole but also on the insulator ($SiO_2$) film, and as a result, a blanket deposition occurs instead of the selective deposition. A deposition amount at the selective deposition portions is relatively decreased by using a portion of the deposition amount for deposition on the insulator layer.

Figure 3:
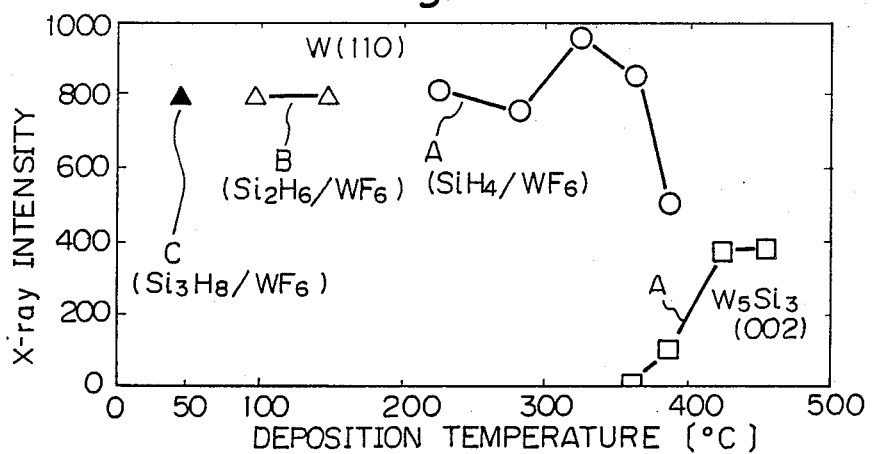
FIG. 3 is a graph showing a relationship between the X-ray intensity and deposition temperature of tungsten layers when using silicon hydride gases.

The X-ray diffraction intensities as a function of deposition temperature of the silicon-containing tungsten layers A, B and C is shown in FIG. 3. For the deposition (A) at $SiH_4/WF_6=1$, the higher the deposition temperature, the smaller the W(110) intensity, and the $W_5Si_3(002)$ diffraction pack appears at a deposition temperature of 360° C. and the intensity thereof is increased in correspondence with the rising temperature. The deposition (B) at $Si_2H_6/WF_6=0.5$ and the growth (C) at $Si_3H_8/WF_6=0.3$ have a tendency similar to that of the deposition (A).

Figure 4:
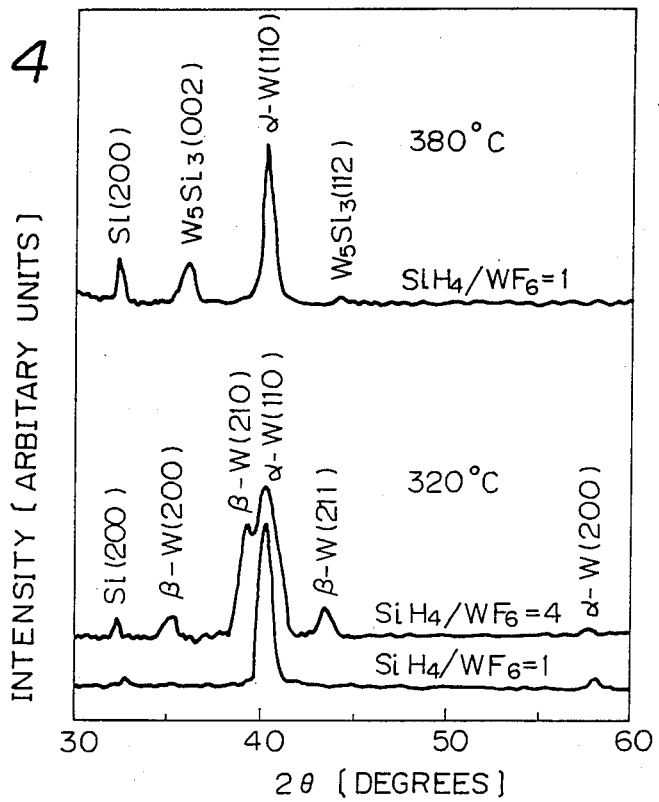
FIG. 4 is a graph showing X-ray diffraction patterns for silicon-containing metal layers when using $WF_6$ gas and $SiH_4$ gas.
Figure 5:
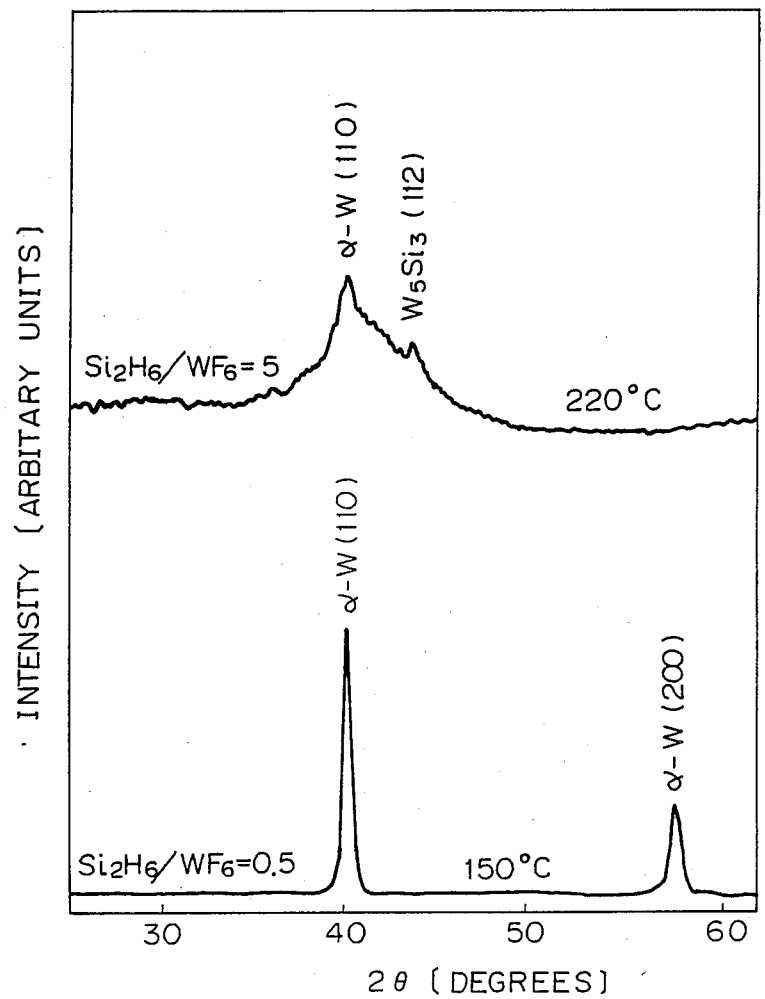
FIG. 5 is a graph showing X-ray diffraction patterns for silicon-containing metal layers when using $WF_6$ gas and $Si_2H_6$ gas.

The X-ray diffraction patterns of the layers for the $WF_6$-$SiH_4$ reaction system at 320° C. and 380° C. ($SiH_4/WF_6=1$) and at 320° C. ($SiH_4/WF_6=4$) are shown in FIG. 4. As seen from FIG. 4, at a constant ratio of the flow rates of the reaction gases ($SiH_4/WF_6=1$), the deposited layer at 320° C. has a tungsten structure, and the deposited layer at 380° C. has a tungsten structure and a $W_5Si_3$ structure. On the other hand, at a constant deposition temperature of 320° C., if the flow rate of $SiH_4$ gas is increased to $SiH_4/WF_6=4$, the silicon-containing tungsten film contains $\beta$-W in addition to $\alpha$-W. This $\beta$-W is a metastable phase which is converted into $\alpha$-W by a heat treatment at 700° to 900° C. and has a high electric resistance. In FIG. 5 similar to FIG. 4, the X-ray diffraction patterns of the layer B for the $WF_6$-$Si_2H_6$ reaction system at 150° C., $Si_2H_6/WF_6=1$ and 220° C., $Si_2H_6/WF_6=5$ are shown. As seen from FIG. 5, the silicon-containing tungsten layer grown at 220° C., $S_2H_6/WF_6=5$ contains $W_5Si_3$ structure in addition to $\alpha$-W(110).

Figure 6:
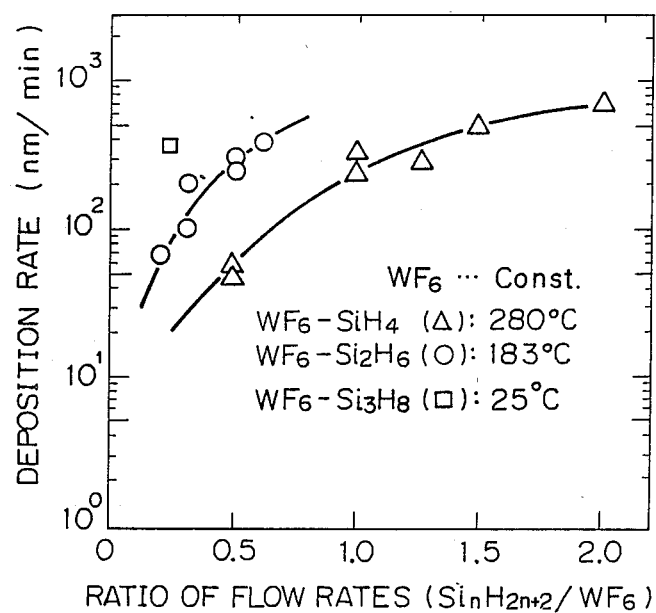
FIG. 6 is a graph showing a relationship between deposition rates and the ratio of flow rates ($Si_nH_{2n+2}/WF_6$)

The present inventor carried out further experiments to determine the relationship between the growth rate and the ratio of the flow rates of the reaction gases ($Si_nH_{2n+2}/WF_6$), as shown in FIG. 6. With a constant flow rate (5 SCCM/min) of the $WF_6$ gas, the flow rates of $SiH_4$, $Si_2H_6$, and $Si_3H_8$ were changed: symbols Δ, o and □, indicate the deposition rates of L the selective deposition of silicon-containing tungsten layers in the $WF_6$-$SiH_4$ reaction system (Δ) at 280° C., in the $WF_6$-$Si_2H_6$ reaction system (o) at 183° C., and in the $WF_6$-$Si_3H_8$ reaction system (□) at 25° C., respectively. For the $SiH_4/WF_6$ reaction system, when the ratio of the flow rates ($SiH_4/WF_6$) exceeded 2, the selective deposition was apt to shift to blanket deposition. For the $Si_2H_6/WF_6$ reaction system, when the ratio of the flow rates ($Si_2H_6/WF_6$) exceeded 1, the selective deposition was apt to shift to blanket deposition. Furthermore, when the ratio of the flow rates ($Si_3H_8/WF_6$) exceeded 0.7, the selective deposition shifted to blanket deposition.

Figure 7:
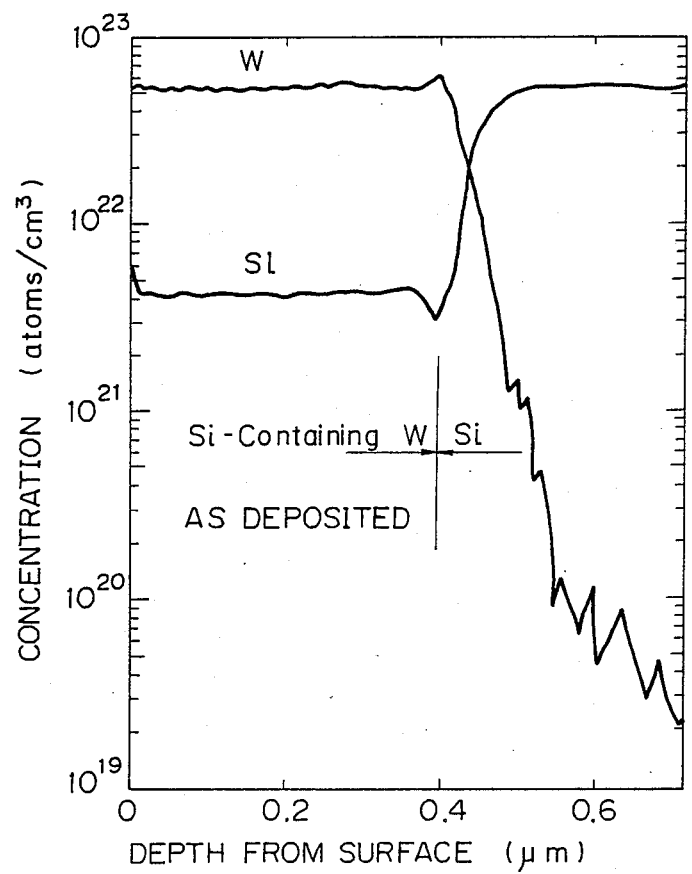
FIG. 7 is a graph showing a composition profile of a silicon-containing tungsten film in the thickness direction.

From these experiments it can be seen that the preferable conditions for selectively forming a silicon-containing tungsten layer by using reaction gases of $WF_6$ and $Si_nH_{2n+2}$ are as follows:

for $SiH_4$ gas, a ratio of the flow rates ($SiH_4/WF_6$) is 2 or less and a deposition temperature is 380° to 180° C., preferably 200° to 180° C., to reduce thermal stress on an interconnection structure;

for $Si_2H_6$ gas, a ratio of the flow rates ($Si_2H_6/WF_6$) is 1 or less and a deposition temperature is 200° to 80° C.; and for Si$_3$H$_8$ gas, a ratio of the flow rates (Si$_3$H$_8$/WF$_6$) is 0.7 or less and a deposition temperature is 100° C. to room temperature. To lower the deposition temperature, Si$_3$H$_8$ gas is most preferable. Where the silicon-containing tungsten layer has the chemical formula WSi$_x$, the molar ratio "x" is 0.1 to 0.12 at SiH$_4$/WF$_6$=2; 0.01 to 0.1 at SiH$_4$/WF$_6$=1; and 0.05 or less at Si$_2$H$_6$/WF$_6$=0.5 and at Si$_3$H$_8$/WF$_6$=0.3. The silicon concentration of the layers is substantially lower than that of tungsten silicide WSi$_2$. A silicon-containing tungsten layer selectively formed at SiH$_4$/WF$_6$=1 has a component distribution in a thickness direction from the surface of the film, as shown in FIG. 7. The atomic concentrations of W and Si (in FIG. 7) are measured by SIMS (secondary ion mass spectrometry). As seen from FIG. 7, the layer has a uniform composition in a layer thickness direction. Furthermore, the silicon-containing tungsten layers formed at a description temperature of 200° C. or less have a resistivity of 8 to 10 $\mu\Omega$cm, which is equivalent to that of a tungsten layer formed by WF$_6$-H$_2$ reaction system. As a ratio of a silicon hydride gas to a WF$_6$ gas is increased, or as the deposition temperature is increased, the resistivity of the layer is apt to increase. The silicon-containing tungsten formed at SiH$_4$/WF$_6$=2 at a deposition temperature of 380° C. had a resistivity of 35 $\mu\Omega$cm.

The reaction between a WF$_6$ gas and a Si$_n$H$_{2n+2}$ gas at a low temperature is expressed as follows:

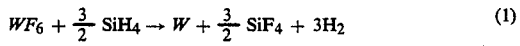  (1)

  (2)

  (3)

As a result, the ratios of the silicon hydride gases to the WF$_6$ gas are as follows:

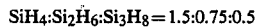

The normalized ratio of the flow rates of the silicon hydride gases to a flow rate of the WF$_6$ gas is indicated as:

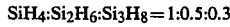

As a higher order silane gas is used, the necessary flow rate thereof becomes smaller. The experimental results in FIG. 6 fully support the above explanation.

In addition to the above-mentioned silicon-containing tungsten layer, layers of silicon-containing refractory metals such as Mo, Ti, Ta, Pt and Pd can be formed. The formation of the silicon-containing refractory metal layer uses a halide gas thereof such as fluoride (MoF$_6$, TiF$_4$, TaF$_5$ or the like) and chloride (WCl$_6$, MoCl$_6$, TiCl$_4$, TaCl$_5$ or the like). Furthermore, the silicon hydride halide gas such as SiH$_2$Cl$_2$ containing chlorine (Cl) and/or fluorine (F) can be used instead of the above-mentioned silicon hydride gas.

The selective formation of silicon-containing metal layer using a silicon hydride gas according to the present invention has a higher growth rate and a lower deposition temperature compared with that of a metal layer formation using a H$_2$ gas, and thus the reaction of a silicon substrate with the metal becomes low, i.e., the encroachment on the silicon substrate is reduced. Since the native oxide thin film of SiO$_2$ or Al$_2$O$_3$ is removed prior to the selective formation (vapor phase deposition) of the silicon-containing metal layer, a layer having an uniform thickness can be stably formed.

Figure 8:
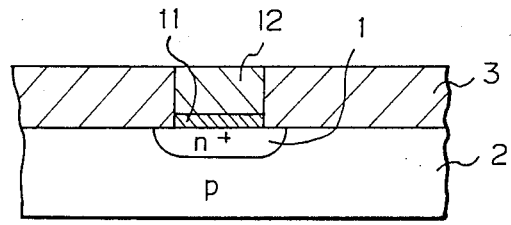
FIG. 8 is a schematic sectional view of a silicon substrate having a contact hole filled with a silicon-containing metal layer and a metal layer.

Referring to FIG. 8, a contact hole is filled with a silicon-containing tungsten thin layer 11 and a tungsten layer 12 in accordance with an embodiment of the method of the present invention.

A contact hole is formed in the insulator layer 3, to expose a surface of the impurity-doped region 1 of the silicon substrate 2, and a silicon-containing tungsten thin film 11 having a thickness of several tens of nanometers is formed on the exposed surface by the above-mentioned selective deposition of a silicon-containing tungsten using a WF$_6$ gas and a Si$_n$H$_{2n+2}$ gas. Thereafter, a tungsten layer 12 is formed by a conventional selective deposition of tungsten using a WF$_6$ gas and a H$_2$ gas, to fill the contact hole, as shown in FIG. 8.

To selectively deposit tungsten, a deposition temperature (substrate heating temperature) is set at, for example, 400° to 600° C., the WF$_6$ gas (2 to 10 SCCM) and the H$_2$ gas (1000 to 2000 SCCM) are used as reaction gases, and a deposition pressure is set at 0.1 to 1 Torr. In this case, a tungsten deposition rate is 200 to 300 nm/min. The reaction of the tungsten deposition is as follows:

  (4)

Moreover, since the silicon-containing thin layer 11 is already formed and serves as a barrier layer, the silicon substrate 2 (i.e., the impurity-doped region 1) is not etched. In this embodiment and, the filler the contact hole is mainly tungsten, and thus the electric resistance of the filler is equivalent to that of a tungsten filler.

The selective deposition of a silicon-containing tungsten layer on an exposed portion of a silicon substrate is explained hereinbefore. It is possible to selectively deposit a silicon containing tungsten on a conductor layer of Al or Al alloy, as explained hereinafter.

Figure 9A:
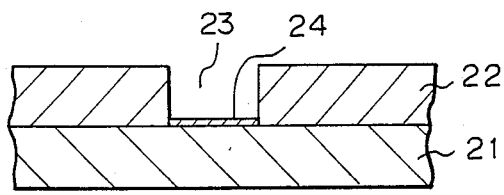
FIGS. 9A-9D are schematic sectional views of conductor (interconnection) layers of Al or Al alloy with a contact hole filled with silicon-containing metal layers, for illustrating a formation process thereof.

As shown in FIG. 9A, an Al alloy conductor layer 21 is formed on an insulating layer (not shown) of a semiconductor device by a conventional method. An interlaminar insulator layer (SiO$_2$ film) 22 is formed over the whole surface including the conductor layer surface, by a CVD process, and the insulator layer 22 is selectively etched to open a contact hole 23 in which a portion of the conductor layer 21 is exposed. Between the etching step and a next step, the exposed Al alloy is oxidized by oxygen in the air, so that an Al$_2$O$_3$ (native oxide) thin layer 24 is formed on the exposed surface thereof.

Figure 9B:
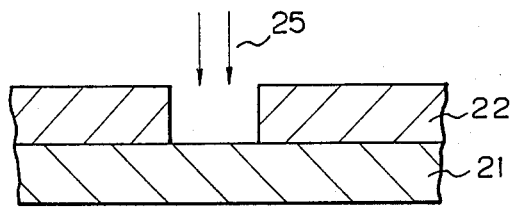

As shown in FIG. 9B, the Al$_2$O$_3$ thin layer 24 is removed by a dry etching treatment using, for example, an inert gas 25. It is also possible to remove the Al$_2$O$_3$ thin layer by a reactive ion etching or an etching using an activated of halide gas (for example, CF$_4$, BCl$_3$, and CCl$_4$) with ultraviolet light.

Figure 9C:
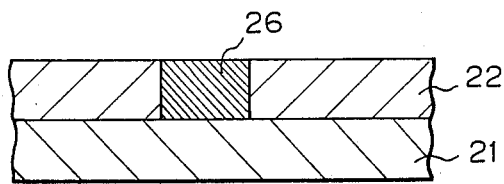

Next, to prevent the exposed Al alloy surface of the conductor layer 21 from being reoxidized, i.e., preventing contact of the exposed surface with air, as shown in FIG. 9C, in accordance with the present invention, a silicon-containing tungsten layer 26 is selectively formed on the exposed Al alloy surface by using a WF$_6$ gas and a silicon hydride gas, to fill the contact hole 23.

Figure 9D:
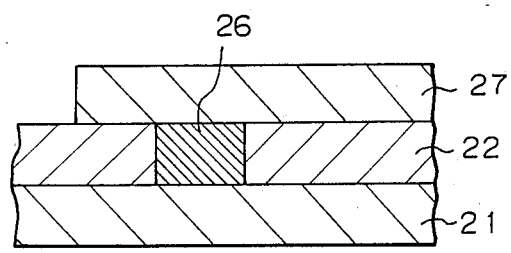

A conductor layer of Al alloy or the like is formed on the whole surface by a sputtering process and is selectively etched, as shown in FIG. 9D, to form a conductor line 27 having a desired pattern, and thus the upper conductor layer 27 is connected to the lower conductor line 21 through the filled silicon-containing tungsten layer 26.

Where the $WF_6$ gas and the $H_2$ gas or silicon hydride gas are used as the reaction gases and come into contact with the Al alloy conductor layer, the $WF_6$ gas reacts with aluminum (Al) to form tungsten and $AlF_3$, as follows:

$$WF_6 + Al \rightarrow W + 2AlF_3 \qquad (5)$$

$AlF_3$ is formed at an interface between the conductor layer (Al alloy) and the deposited tungsten (or silicon-containing tungsten) layer, to increase the contact resistance. $AlF_3$ is decreased by sublimation under conditions of a vacuum pressure and a high temperature (of 400° C. or more). It is possible to suppress $AlF_3$ formation by using the silicon hydride gas, which has a stronger function as a reductor to $WF_6$ than that of the $WF_6$-$H_2$ reaction system (i.e., $H_2 < Al < SiH_4 < Si_2H_6 < Si_3H_8$). For example, for the $WF_6$-$SiH_4$ reaction system, the contact resistance between silicon containing tungsten and Al alloy is 2 to 3 times as large as (at a growth rate of 2 tm/min), and 20 to 30 times as large as (at a growth rate of 0.25 tm/min), that between Al/Al. But, in the $WF_6$-$H_2$ reaction system, the contact resistance between silicon-containing tungsten and the Al alloy is several tens to hundreds of times as large as that between Al/Al, and thus the contact resistance to the Al alloy according to the present invention is smaller than that of the $WF_6$-$H_2$ reaction system.

When a conductor pattern of Al or Al alloy is scaled down, open circuit failures increase due to a generation of voids and hillocks, thermal migration and electromigration.

Figure 12:
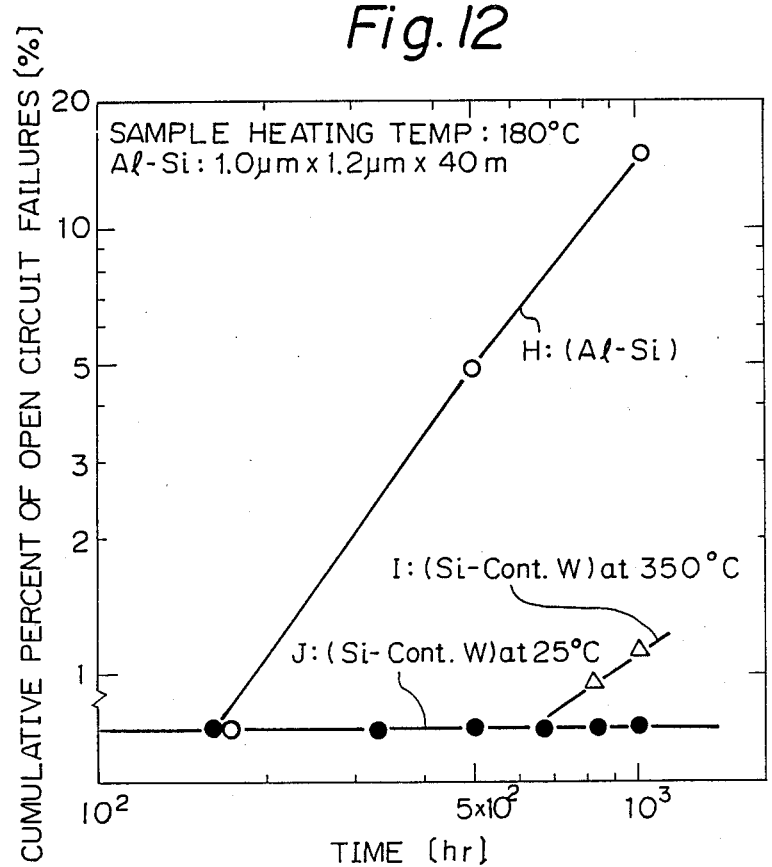
FIG. 12 is a graph showing a cumulative percentage of open circuit failures of Al alloy conductor lines.

The selective formation of a silicon-containing tungsten layer over the conductor pattern according to the present invention effectively decreases these failures. FIG. 12 shows the results of a stress test for Al alloy interconnections of different structures.

Figure 10:
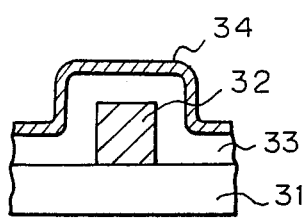
FIG. 10 is a schematic sectional view of a conventional structure comprising an Al alloy conductor line and an insulator film.
Figure 11:
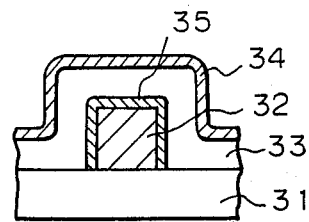
FIG. 11 is a schematic sectional view of a structure comprising an Al alloy conductor line covered with a silicon-containing layer and an insulator layer.

The structure of the sample H in FIG. 12 is shown in FIG. 10 and that of the samples I and J is shown in FIG. 11.

The sample H in FIG. 12 according to the prior art is fabricated in the following manner. As shown in FIG. 10, a PSG insulator film 31 is formed on a silicon substrate (not shown); an Al alloy (Al-Si alloy) layer having a thickness of 1.2 tm is formed over the PSG insulator layer by a sputtering process and is patterned by etching to form a conductor layer 32 having a width of 1.0 tm and a total length of 40 m; another PSG insulator film 33 is formed overall by a CVD process; and a $Si_3N_4$ film 34 is formed on the PSG layer 33 by a CVD process.

As shown in FIG. 11, samples I and J are fabricated in the same manner as that of sample H, except that a silicon-containing tungsten layer 35 is additionally and selectively formed over the Al-Si alloy conductor layer 32. The silicon-containing tungsten layer in sample I is formed using a gas mixture containing $WF_6$ and $SiH_4$ at a ratio of the flow rates of a $WF_6$ gas and a $SiH_4$ gas ($SiH_4/WF_6$) of 1 at a growth temperature of 350° C., and, in sample J, is formed using a gas mixture containing $WF_6$ and $Si_3H_8$ at a rate of the flow rates of a $WF_6$ gas and a $Si_3H_8$ gas ($Si_3H_8/WF_6$) of 0.3 at room temperature.

These samples H, I and J are subjected to accelerated stress testing at a constant heating temperature of 180° C. for 1000 hours, to determine the occurrence of open circuit failures. The result are shown in FIG. 12. A cumulative number of open circuit failures includes the case wherein a conductor layer resistance is increased by 10% or more. As seen from FIG. 12, the number of open circuit failures in sample H of the prior art increase with a lapse of time. In the case of sample J, in which the conductor layer is covered with the silicon-containing tungsten layer deposited at room temperature, the number of open circuit failures does not increase during a test of up to 1000 hours. In sample I having the coating layer of silicon-containing tungsten formed at 350° C., the number of open circuit failures is increased after 700 hours. In this case, the failure increase may be caused by a diminished cross section of the conductor layer 32 caused by a generation of voids and hillocks, by a breakage of the conductor layer, and by other factors. Nevertheless, compared with sample H, it is apparent that the open circuit failures are substantially prevented in samples I and J.

As illustrated in FIGS. 13A to 13D, a multilevel interconnection structure having conductor layers of Al or Al alloy in an semiconductor device is formed in the following manner, using the silicon-containing tungsten deposition method according to the present invention.

Figure 13A:
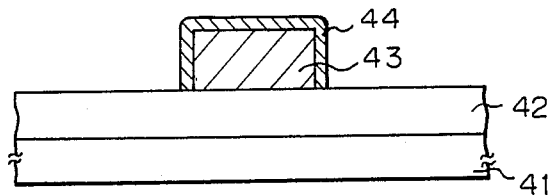
FIGS. 13A-13D are schematic sectional views of a multilavel interconnection structure having Al alloy conductor layers covered with silicon-containing metal layers, for illustrating a formation process thereof.

As shown in FIG. 13A, an insulator layer ($SiO_2$ layer) 42 is formed on a silicon substrate 41 by, for example, a thermal oxidation process. An Al (or Al alloy) layer is formed on the insulator layer 42 by, for example, a sputtering process and is patterned by etching to form a first conductor layer 43 having a desired pattern. Since the Al (or Al alloy) of the conductor layer 43 is very easily oxidized to form an $Al_2O_3$ thin layer (not shown) on the surface thereof, a pretreatment for removing the $Al_2O_3$ thin layer is conducted. For example, a plasma reactive etching process is carried out by using an etching gas of $BCl_3$ (10 SCCM) under a pressure of 0.7 Torr and applying a high-frequency power of 100 W (13.56 MHz), and sequentially, a plasma sputter etching process is carried out by using a $H_2$ gas (500 SCCM) under a pressure of 0.3 Torr and by applying the same high-frequency wave power. In this case, the reactive etching process with $BCl_3$ gas removes most of the $Al_2O_3$ thin layer and the sputter etching process with $H_2$ gas cleans the surface of the conductor layer 43 and that of the insulator layer 42. Thereafter, in accordance with the method of the present invention, a $WF_6$ gas and a silicon hydride ($Si_nH_{2n+2}$) gas are used to selectively form a silicon-containing tungsten layer 44 over the surface of the conductor layer 43 only.

The conditions for a selective formation of the silicon-containing tungsten layer 46 are similar to those for the above-mentioned selective formation thereof on the exposed surface of the silicon substrate. Preferably, the silicon-containing tungsten layer is formed by using a $Si_3H_8$ gas (1 SCCM), a $WF_6$ gas (5 SCCM) and an Ar carrier gas (500 SCCM) under a pressure of 0.3 Torr and at a deposition (growth) temperature of 25° C. (room temperature). In this case, heating of the substrate is not required, and $AlF_3$ is not substantially formed on the Al (or Al alloy) surface (i.e., at the interface of Al and deposited tungsten), since $SiH_8$ is highly reactive as a reducing agent.

Figure 13B:
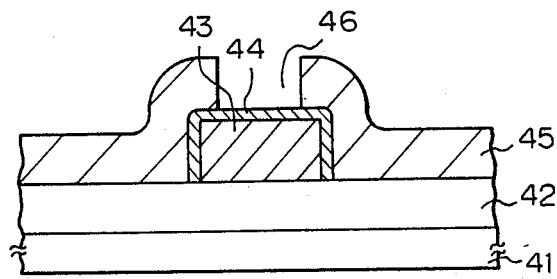

Next, as shown in FIG. 13B, an insulator layer (interlaminar insulating layer) 45 of PSG, SiO₂, etc., is formed overall by a CVD process, and is selectively etched to form a contact hole 46.

Figure 13C:
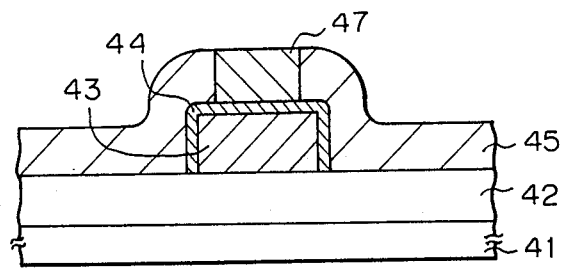

On the silicon-containing tungsten layer 44 exposed in the contact hole, as shown in FIG. 13C, another silicon-containing tungsten layer 47 is selectively formed in the above-mentioned manner using a $WF_6$ gas and a silicon hydride gas, to fill the contact hole.

Figure 13D:
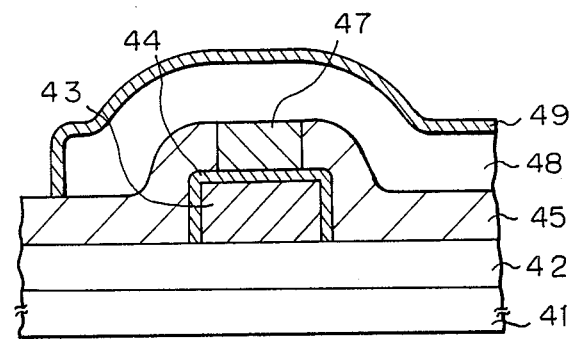

As shown in FIG. 13D, a second conductor layer 48 of Al (or Al alloy) is formed in the same way as the first conductor line 43, and a native oxide $Al_2O_3$ thin layer (not shown) is removed from the surface of the conductor layer 48 by a plasma etching pretreatment. Then a silicon-containing tungsten layer 49 is formed our the surface of the second conductor layer 48 in the same way as for the layer 44 on the first conductor layer 43.

Accordingly, a multilevel interconnection structure having Al (or Al alloy) layers (interconnections) covered with silicon-containing tungsten layers and a filler of the silicon-containing tungsten within the contact hole, is obtained. The obtained structure has a high reliability and a low contact resistance.

Where a silicon-containing tungsten layer is selectively formed on different exposed surfaces (for example, an n-type region surface and a p-type region surface or an exposed surface of an impurity-doped region having a predetermined dose and another exposed surface of another impurity-doped region having a dose which is different from the predetermined dose) of a silicon substrate by using a $WF_6$ gas and a silicon hydride gas in accordance with the method of the present invention, the deposition (growth) of the layer starts at different times, depending on the surfaces, which results in a dispersion of the layer thickness. The lower the deposition temperature, the larger the difference in the starting times. Depending on the surface conditions of a conductor layer of Al (or Al alloy), the surface conditions of a silicon substrate, the impurity conductivity-types of the semiconductor, and the impurity concentrations, an adhesion strength of the silicon-containing layer varies, and the layer may peel off to cause a contact failure. Therefore, the peeled layer becomes a contaminant and has a harmful influence on the growth. To eliminate this defect, preferably a buffer layer of silicon-containing tungsten is formed over an exposed silicon or an exposed Al (or Al alloy), at a high temperature for a short time, prior to the selective formation of the silicon-containing tungsten layer according to the present invention. The deposited buffer layer acts as a deposition nuclei for a following vapor phase deposition, so that the following deposition starts at almost the same time, regardless of the exposed surface conditions. In addition, the high temperature of the initial reaction improves the bonding between the silicon-containing tungsten and the silicon or Al, so that the adhesion strength is increased and is unified throughout the wafer.

The initial reaction is considered to be a self-limited surface reaction between the silicon (or metal) itself and a metal halide gas ($WF_6$ gas).

In the case of silicon, the silicon surface is covered with metal (M) in accordance with the following reaction:

$$MX_n + Si \rightarrow M + SiX_n \quad (6)$$

(M is a metal such as W and X is a halogen such as F)

The present inventor experimentaly confirmed that the initial reaction took place in a time of approximately 10 seconds, and as the temperature is raised, the initial reaction takes place uniformly throughout the wafer. But, if the high temperature deposition is continued after the completion of the initial reaction, a reaction between the silicon substrate and a metal such as tungsten proceeds, whereby the silicon substrate is attached. The high temperature deposition including the initial reaction then must be finished in as short a time as possible (preferably, within 10 to 30 seconds). Thereafter, the silicon-containing tungsten layer is uniformly and thickly formed under a mass-transport limited reaction condition, in which a deposition (growth) rate is not substantially influenced by the (deposition) growth temperature, in accordance with the method of the present invention.

In the case of Al the Al surface is covered not only with metal (M) but also $AlX_n$ (i.e., $AlF_3$), which is simultaneously deposited in accordance with the following reaction:

$$MX_n + Al \rightarrow M + AlX_n \downarrow$$

The deposition of $AlF_3$ can be relatively decreased by adopting a $Al-Si_nH_{2n+2}$ reaction system, in particular, $Al-Si_3H_8$, because $Al-Si_nH_{2n+2}$ has a greater reactivity than $Al-MX_n$. In addition, the deposited $AlF_3$ can be removed by sublimation in a vacuum at a high temperature of 400° C. or more. After completion of the initial reaction, the silicon-containing tungsten layer can be formed in the same manner as for the above-mentioned silicon.

Figure 14:
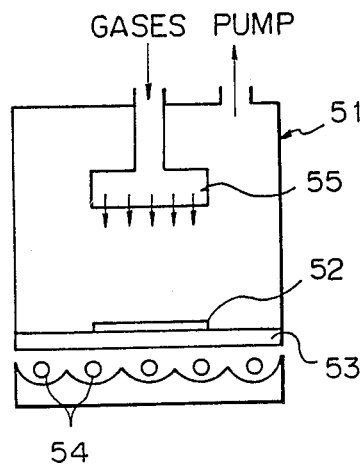
FIG. 14 is a schematic view of a reaction apparatus with a rapid heating device.

The silicon-containing tungsten layer deposition with the buffer layer is carried out as follows.

Where a reaction apparatus 51 shown in FIG. 14 is used, a silicon substrate 52 is put on a transparent plate (for example, of quartz) 53 and heating lamps (infrared lamps) 54 are set under the transparent plate 53. A shower 55 for mixing and spouting reaction gases and a carrier gas ($WF_6 + Si_nH_{2n+2} + H_2 +$ He (or Ar)) is furnished above the silicon substrate 52. The heating lamps can be placed above to heat the substrate from the opposite side. The silicon substrate 52 comes into direct contact with the transparent plate 53, without introducing the reaction gases to the backside of the substrate 52. A gas having no influence on the reaction can be blown onto the backside of the substrate.

Figure 15:
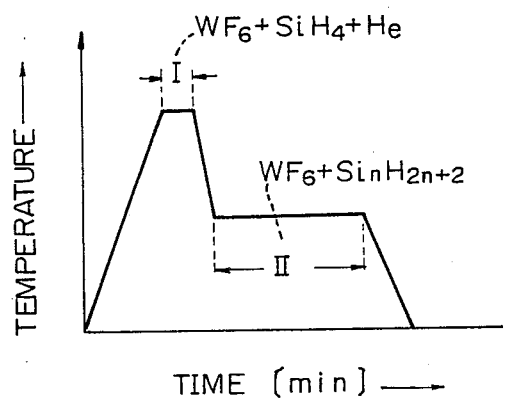
FIG. 15 is a graph of a temperature profile for a method of forming a silicon-containing metal layer according to the present invention, including a high temperature heating step at an initial reaction period.

First, the reaction apparatus 51 is evacuated by a vacuum pump (not shown). As shown in FIG. 15, the silicon substrate 52 is rapidly heated by the heating lamps 54 to a high temperature of, for example, 400° C., and is held thereat for an initial reaction period I of approximately 10 seconds. When the temperature reaches the desired high temperature, a $WF_6$ gas (2 SCCM), a $SiH_4$ gas (2 SCCM) and a He gas (500 SCCM) are allowed to flow through from the shower 55 toward the silicon substrate 52, so that a silicon-containing tungsten buffer layer having a thickness of approximately 10 nm is selectively formed. In the initial reaction period, preferably an inside pressure is set at approximately 0.01–0.1 Torr. An $H_2$ gas can be used instead of the $SiH_4$ gas and an Ar gas used instead of the He gas. Thereafter, the silicon substrate 52 is naturally or forcibly cooled to a temperature suitable for the selective formation of a silicon-containing tungsgsten layer, according to the method of the present invention. Next a $WF_6$ gas and a $Si_nH_{2n+2}$ (n=1, 2, 3, 4) gas are allowed to flow through the shower 55 during a film formation period II, so that a silicon-containing tungsten layer having a desired thickness is selectively formed on the the buffer layer. For example, a $WF_6$ gas (2.5 SCCM) and a $Si_2H_6$ gas (1 SCCM) flow for approximately 1 minute on the silicon substrate 52 heated at approximately 120° C. When a $Si_3H_8$ gas is used as the gas, the deposition is performed at room temperature. In this case, the heating of the silicon substrate is carried out for a short temperature rise time and an initial reaction period I of approximately 10 seconds.

According to the present invention, a silicon-containing metal layer is selectively formed at a lower temperature with a faster deposition (growth) rate than those of a conventional selective deposition of tungsten by using a $WF_6$ gas and a $H_2$ gas. When the method of the present invention is applied to an interconnection of Al or Al alloy, the reliability of the interconnection is increased, whereby the reliability of a semiconductor device is improved.

Furthermore, a silicon-containing metal (refractory metal) layer can be selectively deposited by using $Si_3H_8$ at room temperature. In this case, a heating device or the like is not necessary and the apparatus can be simplified.

It will be obvious that the present invention is not restricted to the above-mentioned embodiments and that many variations are possible for persons skilled in the art without departing from the scope of the invention.

I claim:

1. A method of forming a silicon-containing metal layer on a substrate with a surface of a conductor or a semiconductor and a surface of an insulator by a low pressure chemical vapor deposition using a metal halide gas and a silicon hydride gas as reaction gases, characterized in that a ratio of the flow rate of said silicon hydride gas to that of said metal halide gas is 2 or less and the deposition temperature is 200° C. or less, to selectively deposit said silicon-containing metal layer having a ratio of silicon to metal of 0.6 or less on said surface of the conductor or semiconductor of the substrate.

2. A method according to claim 1 wherein said surface of the conductor or semiconductor is an exposed surface within a contact hole opened in an insulator film or an exposed surface of a conductor layer formed on an insulator.

3. A method according to claim 1 or 2 wherein the metal of said silicon-containing metal layer contains at least one metal selected from the group consisting of tungsten, molybdenum, titanium, tantalum, platinum and palladium.

4. A method according to claim 3 wherein said metal is tungsten.

5. A method according to claim 3 wherein said metal halide gas is a metal fluoride gas.

6. A method according to claim 5 wherein said metal fluoride gas contains one selected from the group consisting of $WF_6$, $MoF_6$, $TaF_5$ and $TiF_4$.

7. A method according to claim 3 wherein said metal halide gas is a metal chloride gas.

8. A method according to claim 7 wherein said metal chloride gas contains one selected from the group consisting of $WCl_6$, $MoCl_6$, $TaCl_5$ and $TiCl_4$.

9. A method according to claim 1 wherein said silicon hydride gas is a gas having a chemical formula: $Si_nH_{2n+2}$ wherein n is at least 1.

10. A method according to claim 3 wherein said silicon hydride gas is a silane ($SiH_4$) gas, said metal halide gas is a $WF_6$ gas, said ratio of flow rate of the $SiH_4$ gas to that of the $WF_6$ gas is two or less, and said deposition temperature is in a range of from 200° to 180° C.

11. A method according to claim 3 wherein said silicon hydride gas is a disilane ($Si_2H_6$) gas, said metal halide gas is a $WF_6$ gas, said ratio of a flow rate of the $Si_2H_6$ gas to that of the $WF_6$ gas is 1 or less, and said deposition temperature is in a range of from 200° to 80° C.

12. A method according to claim 3 wherein said silicon hydride gas is a trisilane ($Si_3H_8$) gas, said metal halide gas is a $WF_6$ gas, said ratio of a flow rate of the $Si_3H_8$ gas to that of the $WF_6$ gas is 0.7 or less, and said deposition temperature is in a range of from 100° C. to room temperature.

13. A method according to claim 1 further comprising the step of cleaning said surface of the conductor or semiconductor by an etching treatment immediately before said vapor phase deposition.

14. A method according to claim 13 wherein said etching treatment is a dry-etching process using an etching gas selected from the group consisting of $NF_3$, carbon halide, $SF_6$, $BCl_3$, $H_2$, and an inert gas.

15. A method according to claim 14 wherein, in said dry-etching process, said etching gas is activated with energy selected from the group consisting of microwaves, high-frequency waves, and an energy ray.

16. A method according to claim 3 further comprising, before said vapor phase deposition, the step of selectively forming a buffer layer of metal, or silicon-containing metal, on said surface of the conductor or semiconductor by heating said surface at a high temperature in the range of from 400° to 500° C. for a short period of from 10 to 30 seconds in a gas mixture containing said metal halide gas and a reducing gas.

17. A method according to claim 16 wherein said buffer layer comprises tungsten which or silicon-containing tungsten is selectively formed by using a $WF_6$ gas and said reducing gas of $H_2$ or $SiH_4$ respectively.

18. A method according to claim 17 wherein said silicon-containing metal layer is formed to a desired thickness on said buffer layer by using a $WF_6$ gas and a $Si_nH_{2n+2}$ where n=2,3, or 4 gas at a ratio of the flow rate of the $Si_nH_{2n+2}$ gas to that of the $WF_6$ gas of 1 or less at a deposition temperature of 200° C. or less.

19. A method of fabricating a semiconductor device provided with a multilevel interconnection structure having conductor layers of aluminum or aluminum alloy, comprising steps of:
(a) forming a first conductor layer on an insulating film formed on a semiconductor substrate;
(b) selectively depositing a first silicon-containing layer on a surface of said first conductor layer without substantial deposit thereof on insulating surfaces;
(c) forming an interlaminar insulating film overall;
(d) selectively etching said interlaminar insulating film to open a contact hole in which a portion of said first conductor layer is exposed;
(e) selectively depositing a second silicon-containing metal layer having a ratio of silicon to metal of 0.6 or less within said contact hole without substantial deposit thereof an insulating surface;
(f) forming a second conductor layer over said second silicon-containing metal layer and said interlaminar insulating film; and (g) selectively depositing a third silicon-containing metal having a ratio of silicon to metal of 0.6 or less layer on said second conductor layer without substantial deposit thereof on insulating surfaces, wherein, said steps (b), (e) and (g) are carried out by using a metal halide gas and a silicon hydride gas as reaction gases at ratio of a flow rate of said silicon hydride gas to that of the metal halide gas of 2 or less at a deposition temperature of 200° C. or less.

20. A method as claimed in claim 1 wherein the ratio of silicon to metal is about 0.01 to 0.1.

21. A method as claimed in claim 19 wherein the ratio of silicon to metal is about 0.01 to 0.1.

* * * * *